(12) United States Patent
Xiao

(10) Patent No.: US 10,014,210 B2
(45) Date of Patent: Jul. 3, 2018

(54) SOI SUBSTRATE AND MANUFACTURING METHOD THEREOF

(71) Applicant: ZING SEMICONDUCTOR CORPORATION, Shanghai (CN)

(72) Inventor: Deyuan Xiao, Shanghai (CN)

(73) Assignee: ZING SEMICONDUCTOR CORPORATION, Shanghai (CN)

( * ) Notice: Subject to any disclaimer, the term of this patent is extended or adjusted under 35 U.S.C. 154(b) by 0 days.

(21) Appl. No.: 15/415,609

(22) Filed: Jan. 25, 2017

(65) Prior Publication Data

US 2017/0256616 A1 Sep. 7, 2017

Related U.S. Application Data

(62) Division of application No. 15/258,899, filed on Sep. 7, 2016.

(30) Foreign Application Priority Data

Mar. 3, 2016 (CN) .......................... 2016 1 0120565

(51) Int. Cl.
*H01L 27/12* (2006.01)
*H01L 21/762* (2006.01)
(Continued)

(52) U.S. Cl.
CPC .. *H01L 21/76254* (2013.01); *H01L 21/26533* (2013.01); *H01L 21/324* (2013.01);
(Continued)

(58) Field of Classification Search
CPC ............. H01J 37/3171; H01J 2237/006; H01J 2237/08; H01L 21/3003; H01L 21/324; H01L 29/167; H01L 29/207; H01L 29/227
See application file for complete search history.

(56) References Cited

U.S. PATENT DOCUMENTS

2008/0315351 A1* 12/2008 Kakehata .............. H01L 27/112
257/507
2010/0237458 A1 9/2010 Kakehata
(Continued)

FOREIGN PATENT DOCUMENTS

JP 2007141946 A 6/2007
JP 2009031784 A 2/2009
(Continued)

OTHER PUBLICATIONS

Office Action dated Sep. 19, 2017 in Japanese Patent Application No. 2016-186873, filed on Sep. 26, 2016 (with English language translation).

*Primary Examiner* — Roy Potter
(74) *Attorney, Agent, or Firm* — Huffman Law Group, PC

(57) ABSTRACT

The present invention application provides a method for manufacturing a SOI substrate, and the method comprising: providing a first semiconductor substrate; growing a first insulating layer on a top surface of the first semiconductor substrate for forming a first wafer; implanting a deuterium and hydrogen co-doping layer at a certain pre-determined depth of the first wafer; providing a second substrate; growing a second insulating layer on a top surface of the second semiconductor substrate for forming a second wafer; bonding the first wafer with the second wafer; annealing the first wafer and second wafer; separating a part of the first wafer from the second wafer; and forming a deuterium and hydrogen co-doping semiconductor layer on the second wafer.

3 Claims, 5 Drawing Sheets

(51) Int. Cl.
*H01L 21/265* (2006.01)
*H01L 21/324* (2006.01)
*H01L 21/84* (2006.01)
*H01L 29/06* (2006.01)
*H01L 29/167* (2006.01)
*H01L 29/207* (2006.01)
*H01L 29/227* (2006.01)

(52) U.S. Cl.
CPC .......... *H01L 21/84* (2013.01); *H01L 27/1203* (2013.01); *H01L 29/0649* (2013.01); *H01L 29/167* (2013.01); *H01L 29/207* (2013.01); *H01L 29/227* (2013.01)

(56) References Cited

U.S. PATENT DOCUMENTS

2010/0317140 A1   12/2010   Brailove et al.
2017/0110362 A1*   4/2017   Xiao .................. H01L 21/3003

FOREIGN PATENT DOCUMENTS

JP         2014017513 A      1/2014
WO    WO2015112308 A1      7/2015

* cited by examiner

SOI SUBSTRATE AND MANUFACTURING METHOD THEREOF

CROSS REFERENCE TO RELATED APPLICATION(S)

This application is a divisional of U.S. patent application Ser. No. 15/258,899, filed on Sep. 7, 2016 which claims priority from P.R.C. Patent Application No. 201610120565.2, filed on Mar. 3, 2016, the contents of which are hereby incorporated by reference in their entirety for all purposes.

TECHNICAL FIELD

The present invention relates to a semiconductor substrate and a method for manufacturing the semiconductor substrate, and particularly relates to a silicon on insulator substrate and a method for manufacturing the silicon on insulator substrate.

BACKGROUND

In recent years, many industries have used silicon on insulator (SOI) substrate to manufacture a semiconductor integrated circuit instead of using a piece of a silicon wafer. Because using an SOI substrate has an advantage of reducing the parasitic capacitance between a drain and a substrate, whereby a performance of a semiconductor integrated circuit can be promoted.

With regard to a method for manufacturing a semiconductor device, such as U.S. Pat. No. 5,374,564, which provides a method for doping hydrogen ions into a silicon wafer, and forming an ion doped layer at a pre-determined depth of the silicon wafer. Then the silicon wafer doped by hydrogen ions is coupled with another silicon wafer, and a silicon oxide film is formed between the two silicon wafers. Then the two silicon wafers are separated at the ion doped layer by a heat treatment, whereby a monocrystalline silicon film can be formed on the ion doped layer.

For example, U.S. Pat. No. 5,872,387 provides a method for annealing a substrate growth, a gate oxide layer at a deuterium atmosphere, whereby dangling bonds between the gate oxide and the substrate can be removed. However, this method should be proceeding at a very high deuterium pressure, so that a cost for manufacturing a semiconductor device is increased.

In view of prior arts described above, an improved method is needed for manufacturing a SOI substrate, which at least solves drawbacks described above.

SUMMARY

An object of the present invention application is to provide a silicon on insulator substrate and a method thereof, wherein the SOI substrate has an advantage of reducing the parasitic capacitance between a drain and a substrate, and the cost for manufacturing the SOI substrate can be reduced.

In order to solving the above problems, the present invention application provides a method for manufacturing a SOI substrate, and the method comprising: providing a first semiconductor substrate; growing a first insulating layer on a top surface of the first semiconductor substrate for forming a first wafer; irradiating the first semiconductor substrate via a ion beam for forming a deuterium and hydrogen co-doping layer to a pre-determined depth from a top surface of the first insulating layer; providing a second substrate; growing a second insulating layer on a top surface of the second semiconductor substrate for forming a second wafer; bonding the first wafer with the second wafer in a face to face manner; annealing the first wafer and second wafer; separating a part of the first wafer from the second wafer; forming a deuterium and hydrogen co-doping semiconductor layer on the second wafer.

The present invention application further provides a SOI substrate comprising: a semiconductor substrate; an insulating layer grown on a top surface of the semiconductor substrate; and a deuterium and hydrogen co-doping semiconductor layer grown on the insulating layer.

BRIEF DESCRIPTION OF THE DRAWINGS

Exemplary embodiments will be more readily understood from the following detailed description when read in conjunction with the appended drawing, in which.

DETAILED DESCRIPTION

For a more complete understanding of the present disclosure and its advantages, reference is now made to the following description taken in conjunction with the accompanying drawings, in which like reference numbers indicate like features. Persons having ordinary skill in the art will understand other varieties for implementing example embodiments, including those described herein.

Figure 1:
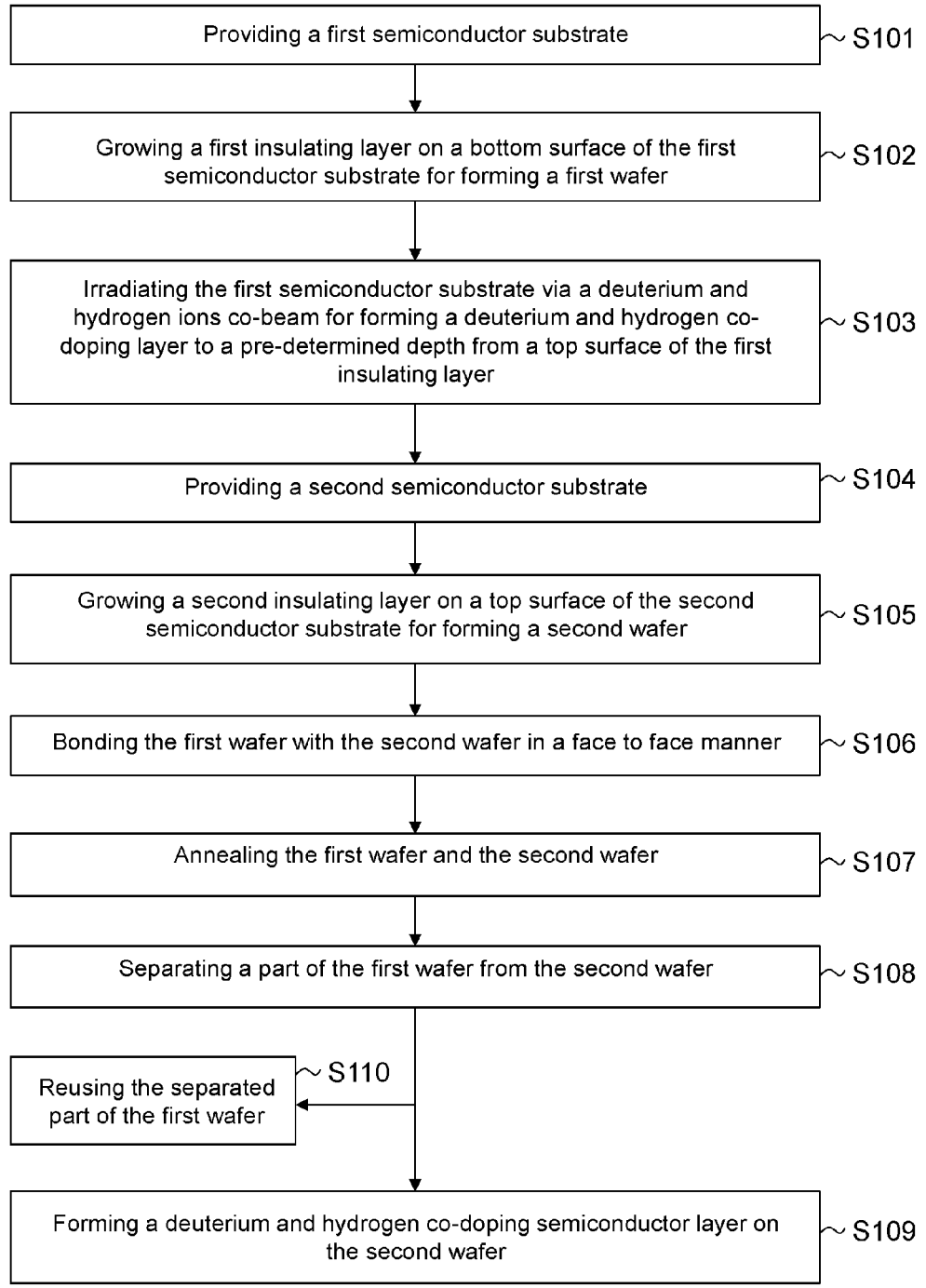
FIG. 1 is a flowchart of a method for manufacturing a silicon on insulator substrate according to one embodiment of the present invention.

FIG. 1 provides a method for manufacturing a silicon on insulator substrate according to one embodiment of this invention, and the manufacture method comprises:

Step101(S101): providing a first semiconductor substrate;

Step102(S102): growing a first insulating layer on a bottom surface of the first semiconductor substrate for forming a first wafer;

Step103(S103): Deuterium and hydrogen being used for source gases, and irradiating the first semiconductor substrate via a deuterium and hydrogen ions co-beam for forming a deuterium and hydrogen co-doping layer to a pre-determined depth from a top surface of the first insulating layer;

Step104(S104): providing a second semiconductor substrate;

Step105(S105): growing a second insulating layer on a top surface of the second semiconductor substrate for forming a second wafer;

Step106(S106): bonding the first wafer with the second wafer in a face to face manner;

Step107(S107): annealing the first wafer and the second wafer;

Step108(S108): separating a part of the first wafer from the second wafer; and

Step109(S109): forming a deuterium and hydrogen co-doping semiconductor layer on the second wafer;

Step110(S110): reusing the separated part of the first wafer.

In order to describe the method for manufacturing the silicon on insulator more specifically, FIGS. 2A-2G provide cross-sectional views of a process for manufacturing a silicon on insulator substrate.

Figure 2A:
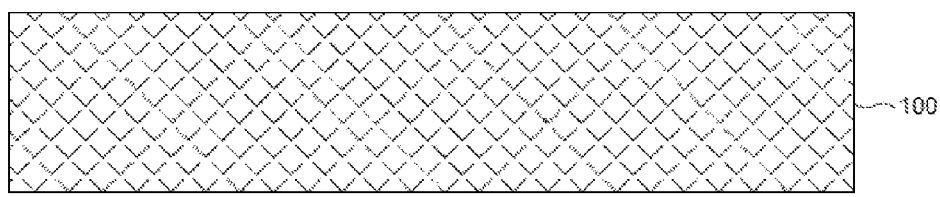
FIGS. 2A-2H are cross-sectional views of a process for manufacturing a silicon on insulator substrate.

The first step is referred to FIG. 2A, a first semiconductor substrate 100 is provided, wherein the material of the first semiconductor substrate 100 may be Group IV, SiGe, III-V group compound, Group III-Nitrogen compound, or II-VI group compound. In one embodiment, the material of the first semiconductor substrate 100 is single crystal silicon. In another embodiment, the material of the first semiconductor substrate 100 is SiGe, and the weight percent of germanium is between 5%~90%.

Figure 2B:
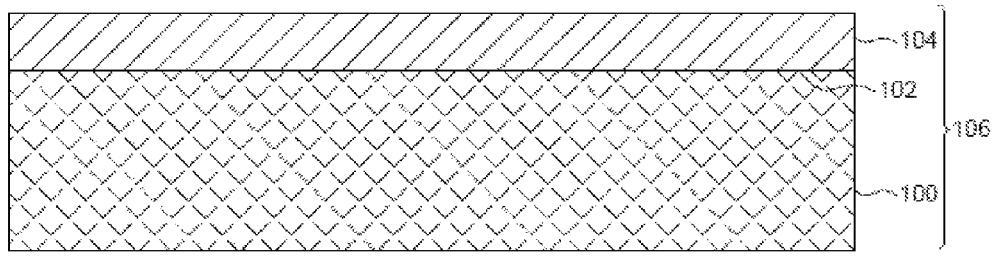

The next process is referred to FIG. 2B, a first insulating layer 104 is grown on a top surface 102 of the first semiconductor substrate 100 for forming a first wafer 106, wherein the material of the first insulating layer 104 may include silicon dioxide, silicon nitride, or aluminum nitride. In one embodiment, the material of the first insulating layer is silicon dioxide and the thickness of the first insulating layer 104 may be between 0.1 nm and 500 nm.

Figure 2C:
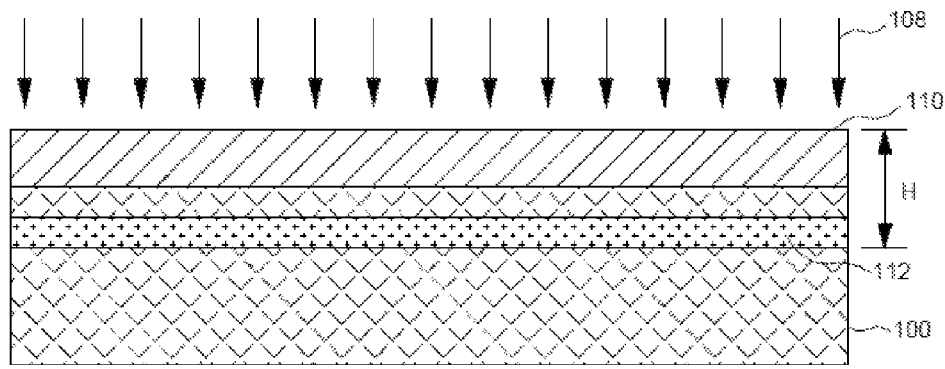

The next process is referred to FIG. 2C, hydrogen and deuterium can be processed by an electric field for producing a hydrogen plasma and a deuterium plasma, and a hydrogen ion and deuterium ion co-beam may be generated through taking hydrogen ions of a hydrogen plasma and deuterium ions of a deuterium plasma. The first wafer 106 is illuminated by a hydrogen and deuterium ions co-beam 108 for implanting a deuterium and hydrogen co-doping layer 112 at a pre-determined depth H from a top surface 110 of the first insulating layer 110. The pre-determined depth H may be controlled by an accelerated energy of the hydrogen and deuterium ions co-beam 108 and an incident angle of the hydrogen and deuterium ions co-beam 108, wherein the accelerated energy of the hydrogen and deuterium ions co-beam 108 may be controlled by an accelerated voltage and a doped concentration. In one embodiment, the pre-determined depth H is between 0.1 m and 5 μm, an accelerated voltage of the hydrogen and deuterium ions co-beam 108 is between 1 keV and 200 keV, and a doping dosage of the hydrogen and deuterium ions co-beam 108 is between $10^{16}$ ions/cm² and $2\times10^{17}$ ions/cm².

Figure 2D:
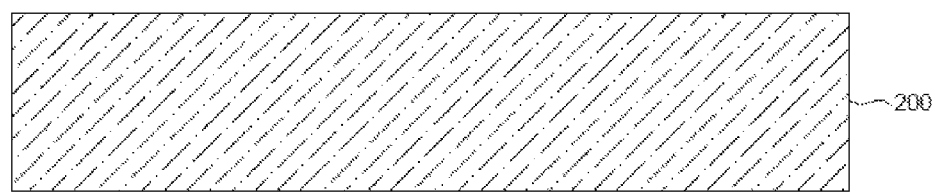

The next step is referred to FIG. 2D, a second semiconductor substrate 200 is provided, wherein the material of the second semiconductor substrate 200 may include IV group element, silicon-germanium (SiGe), III-V group compound, III group-nitrogen compound, or II-VI group compound. In one embodiment, the material of the second semiconductor substrate 200 is single crystal silicon.

Figure 2E:
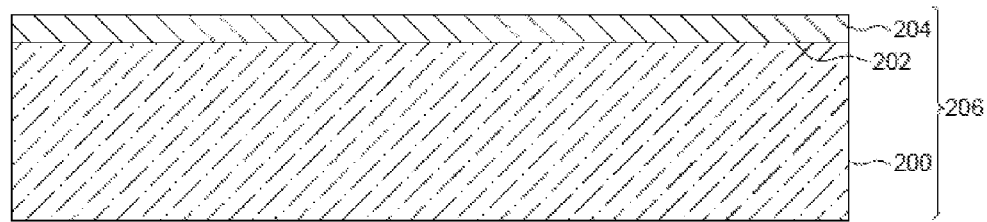

The next process is referred to FIG. 2E, a second insulating layer 204 is grown on a top surface 202 of the second semiconductor substrate 200 for forming a second wafer 206, wherein the material of the second insulating layer 204 may include silicon dioxide, silicon nitride, or aluminum nitride. In one embodiment, the material of the second insulating layer 204 is silicon dioxide and the thickness of the second insulating layer 204 may be between 0.05 nm and 10 nm.

Figure 2F:
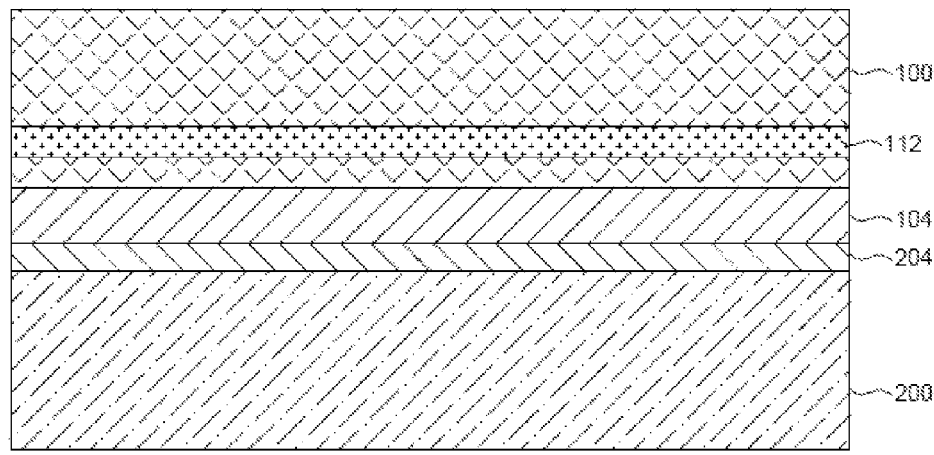

The next step is referred to FIG. 2F, the first wafer 106 is bonded with the second wafer 206 face to face. In one embodiment, the first wafer 106 is bonded with second wafer 206 through hydrophilic bonding process, wherein the first wafer 106 is bonded with second wafer 206 at a temperature between 200 degrees centigrade and 400 degrees centigrade. The detail steps of hydrophilic bonding process further comprises the steps of: wetting the first insulating layer 104 and the second insulating layer 204; contacting the wetted first insulating layer 104 with the wetted second insulating layer 204; and pressing the first insulating layer 104 and the second insulating layer 204 for closely bonding the first insulating layer 104 with the second insulating layer 204.

Figure 2G:
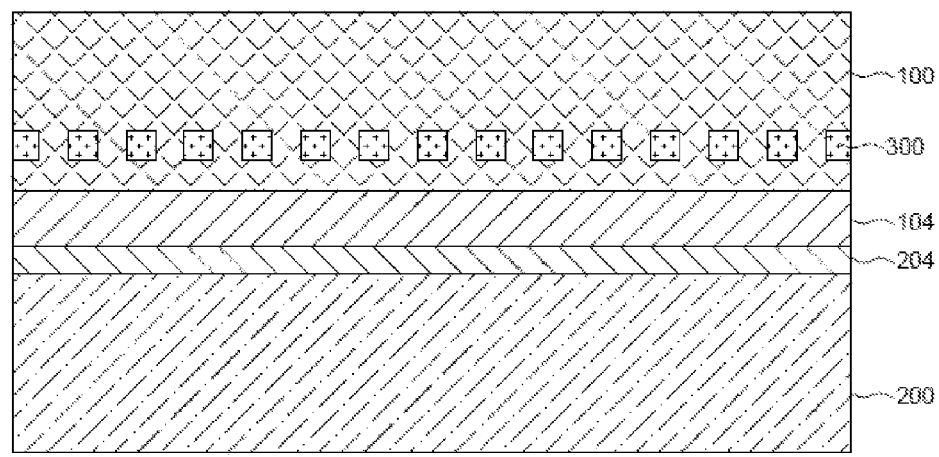

The next step is referred to FIG. 2G, the first wafer 106 and the second wafer 206 are annealed, and the annealing process comprises the steps of: heating the first wafer 106 and the second wafer 206 to a temperature between 600 degrees centigrade and 900 degrees centigrade; cooling the first wafer 106 and the second wafer 206 to a temperature between 400 degrees centigrade and 600 degrees centigrade, wherein time for cooling the first wafer 106 and the second wafer 206 is between 30 minutes and 120 minutes. After annealing the first wafer 106 and the second wafer 206, the deuterium and hydrogen co-doping layer 112 are transferred to a plurality of deuterium and hydrogen co-doping bubbles 300.

Figure 2H:
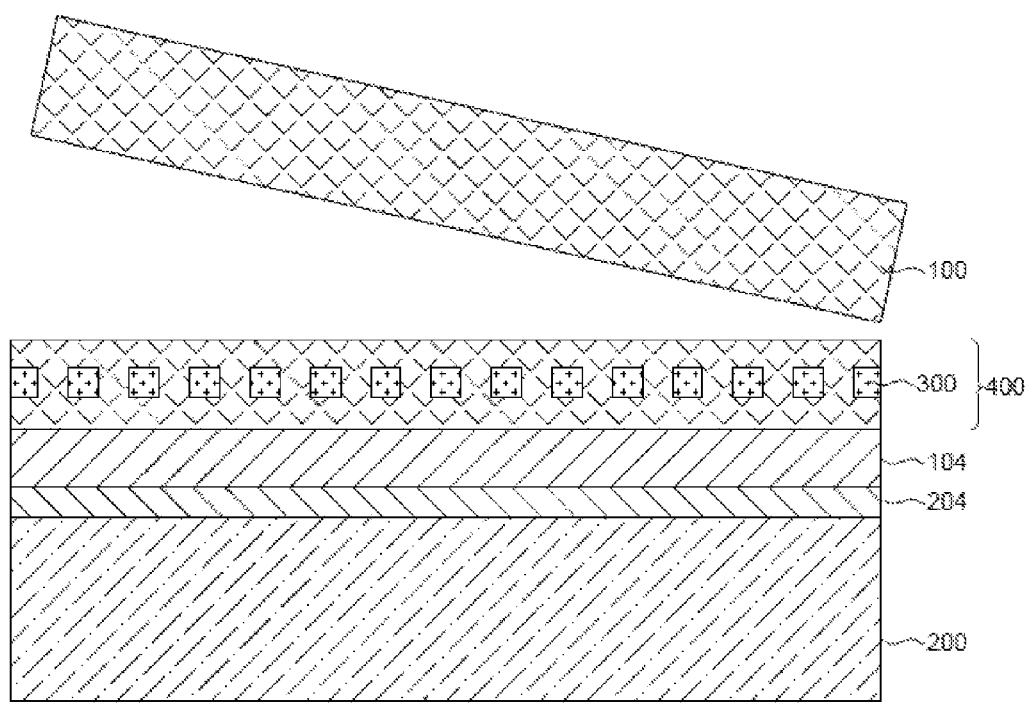

The next step is referred to FIG. 2H, a part of the first wafer 106 is separated from the second wafer 206 for forming a deuterium and hydrogen co-doping semiconductor layer 400, wherein the deuterium and hydrogen co-doping semiconductor layer 400 is bonded with the first insulating layer 104 and a thickness of the deuterium and hydrogen co-doping semiconductor layer 400 is between 50 Å and 50000 Å, and the deuterium and hydrogen co-doping bubbles 300 are in the deuterium and hydrogen co-doping semiconductor layer 400.

It is worth noting that the separated part of the first wafer 106 may further be proceeded with chemical-mechanical polishing (CMP) and cleaned, so that the separated part of the first wafer 106 may be reused for economizing on cost. The second wafer 106 bonded with the deuterium and hydrogen co-doping semiconductor layer 400 may further be heated to 10000 degrees centigrade, and time for heating the second wafer 106 is between 30 minutes and 8 hours.

Because a dangling bond has a higher activity, a trap center may be produced to cause that an electron is bonded with an electron hole once again. Consequently a resilience of a semiconductor device to hot carrier effects is decreased. This invention provides a SOI substrate for manufacturing a semiconductor device. The SOI substrate can reduce a parasitic capacitance between a drain and a source of the semiconductor device, deuterium atoms (or deuterium ions) doped in the SOI substrate may be diffused into an interface between a gate oxide and the SOI substrate after growing the gate oxide on the SOI substrate, and deuterium atoms (or deuterium ions) are covalently bonded to semiconductor atoms for eliminating the dangling bond and increasing the resilience of the semiconductor device to hot carrier effects. Moreover, the method for manufacturing the SOI substrate doesn't need a very high deuterium pressure, and the cost for manufacturing the SOI substrate can be reduced substantially.

While various embodiments in accordance with the disclosed principles have been described above, it should be understood that they are presented by way of example only, and are not limiting. Thus, the breadth and scope of exemplary embodiment(s) should not be limited by any of the above-described embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

What is claimed is:

1. A silicon on insulator substrate, comprising:
    a semiconductor substrate;
    an insulating layer grown on a top surface of the semiconductor substrate; and a deuterium and hydrogen co-doping semiconductor layer grown on a top surface of the insulating layer.

2. The silicon on insulator substrate according to claim 1, wherein a material of the semiconductor substrate includes IV group element, silicon-germanium (SiGe), III-V group compound, III group-nitrogen compound, or II-VI group compound.

3. The silicon on insulator substrate according to claim 1, wherein a thickness of the deuterium and hydrogen co-doping semiconductor layer is between 50 Å and 50000 Å.

* * * * *